United States Patent
Boyd, Jr. et al.

(10) Patent No.: US 9,558,981 B2
(45) Date of Patent: Jan. 31, 2017

(54) CONTROL SYSTEMS EMPLOYING DEFLECTION SENSORS TO CONTROL CLAMPING FORCES APPLIED BY ELECTROSTATIC CHUCKS, AND RELATED METHODS

(71) Applicant: Applied Materials, Inc., Santa Clara, CA (US)

(72) Inventors: Wendell Boyd, Jr., Morgan Hill, CA (US); Vijay D. Parkhe, San Jose, CA (US); Matthew Busche, Santa Clara, CA (US); Konstantin Makhratchev, Fremont, CA (US); Masanori Ono, Chiba (JP); Senh Thach, Union City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 390 days.

(21) Appl. No.: 14/158,112

(22) Filed: Jan. 17, 2014

(65) Prior Publication Data

US 2015/0138687 A1    May 21, 2015

Related U.S. Application Data

(60) Provisional application No. 61/906,175, filed on Nov. 19, 2013.

(51) Int. Cl.
*H01L 21/683* (2006.01)
*H01L 21/67* (2006.01)

(52) U.S. Cl.
CPC ..... *H01L 21/6833* (2013.01); *H01L 21/67288* (2013.01)

(58) Field of Classification Search
CPC .................. H01L 21/67288; H01L 21/6833
USPC ........................................... 361/234
See application file for complete search history.

(56) References Cited

U.S. PATENT DOCUMENTS

| | | | | |
|---|---|---|---|---|
| 5,094,536 A | * | 3/1992 | MacDonald | B23Q 1/032 250/491.1 |
| 6,075,375 A | * | 6/2000 | Burkhart | H01L 21/67259 324/662 |
| 6,215,640 B1 | * | 4/2001 | Hausmann | H01L 21/6833 361/115 |
| 6,950,193 B1 | * | 9/2005 | Discenzo | G01B 11/06 356/482 |
| 2012/0070996 A1 | * | 3/2012 | Hao | H01L 21/68742 438/710 |

* cited by examiner

*Primary Examiner* — Thienvu Tran
*Assistant Examiner* — Kevin J Comber
(74) *Attorney, Agent, or Firm* — Patterson & Sheridan, LLP

(57) ABSTRACT

A control system that includes deflection sensors which can control clamping forces applied by electrostatic chucks, and related methods are disclosed. By using a sensor to determine a deflection of a workpiece supported by an electrostatic chuck, a control system may use the deflection measured to control a clamping force applied to the workpiece by the electrostatic chuck. The control system applies a clamping voltage to the electrostatic chuck so that the clamping force reaches and maintains a target clamping force. In this manner, the clamping force may secure the workpiece to the electrostatic chuck to enable manufacturing operations to be performed while preventing workpiece damage resulting from unnecessary higher values of the clamping force.

15 Claims, 14 Drawing Sheets

CHANGE IN A PORTION OF REFLECTED RADIATION DETECTED

CONTROL SYSTEMS EMPLOYING DEFLECTION SENSORS TO CONTROL CLAMPING FORCES APPLIED BY ELECTROSTATIC CHUCKS, AND RELATED METHODS

CROSS-REFERENCE TO RELATED APPLICATION

This application claims the benefit of U.S. Provisional Patent Application Ser. No. 61/906,175, entitled "Control Systems Employing Deflection Sensors To Control Clamping Forces Applied By Electrostatic Chucks, And Related Methods," and filed Nov. 19, 2013, which is herein incorporated by reference.

BACKGROUND

Field

Embodiments of the present invention generally relate to substrate supports used in processing chambers for fabricating microelectronic devices and, more specifically, to electrostatic chucks used in plasma processing chambers.

Description of the Related Art

In high precision manufacturing, for example semiconductor manufacturing, a workpiece may need to be precisely held by a fixture during manufacturing operations to increase uniform quality and reduce defects. In some manufacturing operations an electrostatic chuck may be used as the fixture to hold the workpiece against a supporting structure using an electrostatic force ("clamping force") of the electrostatic chuck to precisely hold the workpiece during one or more manufacturing operations.

It is common in manufacturing operations that the workpieces in high-precision manufacturing operations should be held by a minimum clamping force as possible with the lowest possible contact to the workpiece to reduce defects. However, because of manufacturing variances such as surface treatments applied to workpieces that can change chucking force, and because of environmental effects, manufacturing personnel often increase the target clamping force to provide a factor of safety to ensure that at least a sufficient clamping force is being applied to counter the variances and effects.

A large majority of the electrostatic chucks used in semiconductor manufacturing industry are believed to apply clamping forces that are greater than required. This "overchucking" causes damage to the workpiece, for example, by causing craters in a backside of the workpiece, embedding parts of the electrostatic chuck into the workpiece, and/or causing particulates which cause quality problems on the frontside of the workpiece.

Conventional approaches to reduce the overchucking problems have included measuring an electrical potential of the workpiece before the clamping force is applied which can impact clamping force and utilizing an algorithm to compensate for the electrical potential of the workpiece to maintain a minimum clamping force. As manufacturing tolerances become increasingly tighter and the need to reduce costs becomes more important, new approaches are needed to provide a more consistent and predictable clamping force to accommodate a wider range of manufacturing variances.

SUMMARY

Embodiments disclosed herein include a control system that includes deflection sensors which can control clamping forces applied by electrostatic chucks, and related methods. By using a sensor to determine a deflection of a workpiece supported by an electrostatic chuck, a control system may use the deflection measured to control a clamping force applied to the workpiece by the electrostatic chuck. The control system applies a clamping voltage to the electrostatic chuck so that the clamping force reaches and maintains a target clamping force. In this manner, the clamping force may secure the workpiece to the electrostatic chuck to enable manufacturing operations to be performed while preventing workpiece damage resulting from unnecessary higher values of the clamping force.

In one embodiment a control system is disclosed. The control system includes an electrostatic chuck. The control system also includes a sensor positioned to determine a deflection of a workpiece into at least one recess of the electrostatic chuck as the electrostatic chuck applies a clamping force to the workpiece. The control system may also include a controller programmed to determine from the deflection a clamping force applied to the workpiece by the electrostatic chuck. The controller may also be programmed to adjust a clamping force at the electrostatic chuck so that the clamping force reaches and maintains a target clamping force. In this manner, the clamping force may be applied by the electrostatic chuck to the workpiece without causing damage to the workpiece.

In another embodiment, a method for controlling a clamping force of an electrostatic chuck is disclosed. The method may include determining with a sensor a deflection of a workpiece into at least one recess of an electrostatic chuck. The method may also include determining with a controller a clamping force applied to the workpiece by the electrostatic chuck. The method may further include applying with the controller a clamping voltage to the electrostatic chuck so that a clamping force reaches and maintains a target clamping force. In this manner, uniform quality may be obtained for the workpiece and other workpieces sequentially secured to the electrostatic chuck as the clamping forces applied to each of the workpieces may be controlled to minimize damage.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings and included to provide a further understanding, and are incorporated in and constitute a part of this specification. The drawings illustrate one or more embodiment(s), and together with the description serve to explain principles and operation of the various embodiments.

BRIEF DESCRIPTION OF THE DRAWINGS

So that the manner in which the above recited features of embodiments of the present invention can be understood in detail, a more particular description of embodiments of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for embodiments of the invention may admit to other equally effective embodiments.

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein; rather, these embodiments are provided so that this disclosure will satisfy applicable legal requirements. Whenever possible, like reference numbers will be used to refer to like components or parts.

Embodiments disclosed herein include a control system that includes deflection sensors which can control clamping forces applied by electrostatic chucks, and related methods. By using a sensor to determine a deflection of a workpiece supported by an electrostatic chuck, a control system may use the deflection measured to control a clamping force applied to the workpiece by the electrostatic chuck. The control system applies a clamping voltage to the electrostatic chuck so that the clamping force reaches and maintains a target clamping force. In this manner, the clamping force may secure the workpiece to the electrostatic chuck to enable manufacturing operations to be performed while preventing workpiece damage resulting from unnecessary higher values of the clamping force.

Figure 1A:
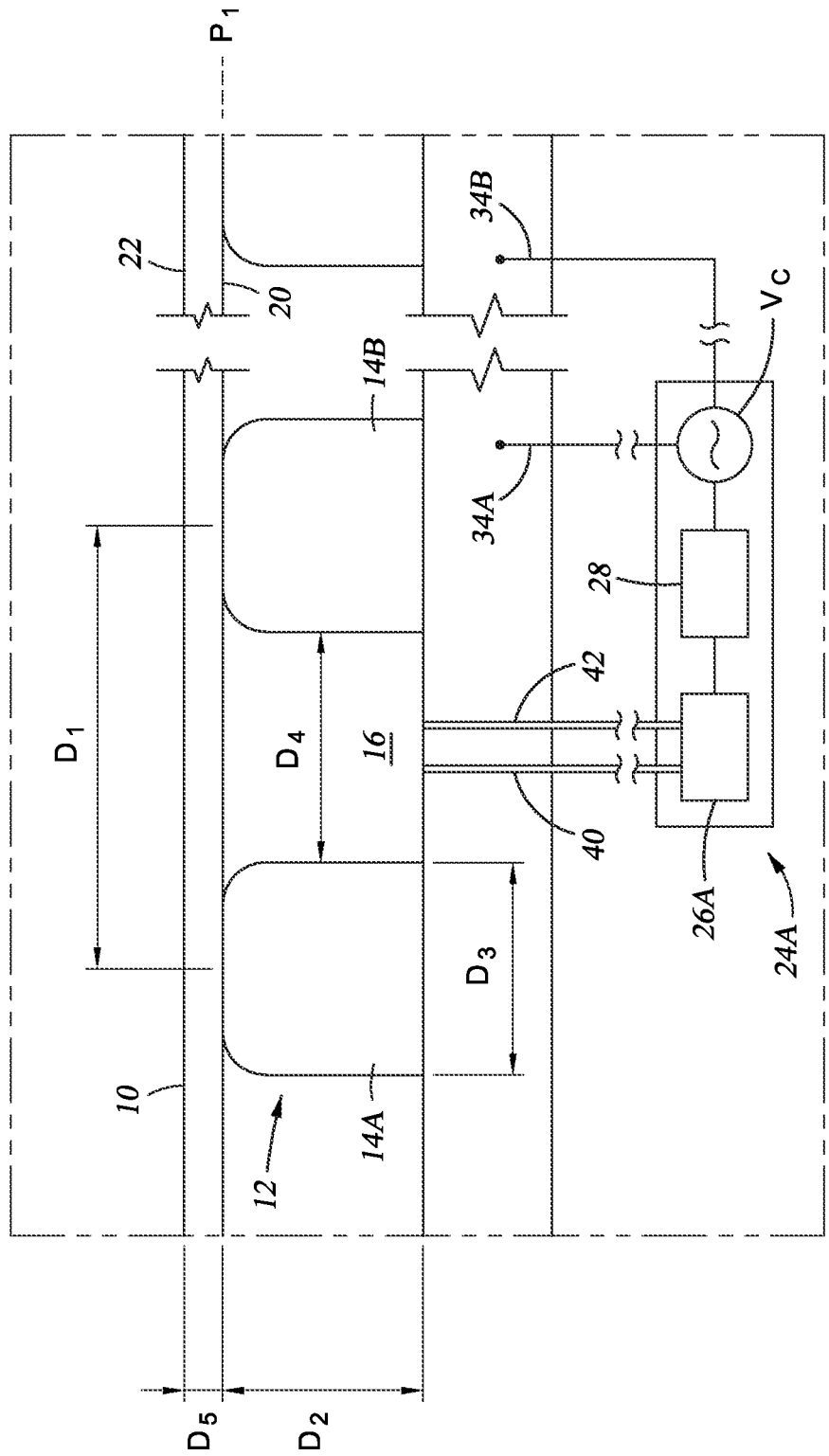
FIG. 1A is a side view of an exemplary workpiece abutting against an exemplary electrostatic chuck of a control system which is ready to apply a clamping force to the workpiece.

FIG. 1A is a close-up side sectional view of an exemplary workpiece 10 abutting against an exemplary electrostatic chuck 12, so that the workpiece 10 may be later secured together with a clamping force Fc. The workpiece 10 may be, for example, a silicon wafer used in semiconductor manufacturing. The electrostatic chuck 12 may comprise adjacent mesas 14A, 14B of a plurality of mesas which extend from the electrostatic chuck 12. The mesas 14A, 14B of the electrostatic chuck 12 may be configured to abut against the workpiece 10 to support the workpiece 10 with force Fm. The mesas 14A, 14B form a recess 16 therebetween in which there is no contact between the workpiece 10 and the electrostatic chuck 12. In this manner, the opportunity for damage to the workpiece 10 may be reduced as the adjacent mesas 14A, 14B minimize contact of the electrostatic chuck 12 with the workpiece 10 which may otherwise scratch the workpiece 10 and the recess 16 may be used to thermally manage a temperature of the workpiece 10.

With continued reference to FIG. 1A, the adjacent mesas 14A, 14B may have centers separated by a distance D1. The distance D1 may be in a range, for example, from 0.3 inches to 0.5 inches, in one embodiment. The adjacent mesa 14A, 14B may each have a height of a distance D2 and a width of D3. The distance D2 may be in a range, for example, from fifty (50) to seven hundred (700) microns. The distance D3 may be in a range, for example, from five hundred (500) to five thousand (5000) microns. In this manner, a recess having a width of distance D4 may be formed. The distance D4 may be in a range, for example, from two (2) to ten (30) millimeters. The distance D5 may be in a range from two hundred (200) to one thousand five hundred (1500) microns. In this manner, the electrostatic chuck 12 may support the workpiece 10 and enable thermal management of the workpiece 10.

It is noted that the mesas 14A, 14B may temporarily support the workpiece 10 without the clamping force Fc applied so that a geometric plane P1 may be tangent to a backside 20 of the workpiece 10 adjacent to the recess 16. In that the case when the workpiece 10 may not exhibit perfect flatness, the geometric plane P1 may, or may not be, tangent to surfaces of the mesas 14A, 14B. In any case, the geometric plane P1 may serve as a datum from which a deflection Z of the workpiece 10 into the recess 16 may be measured.

Figure 1B:
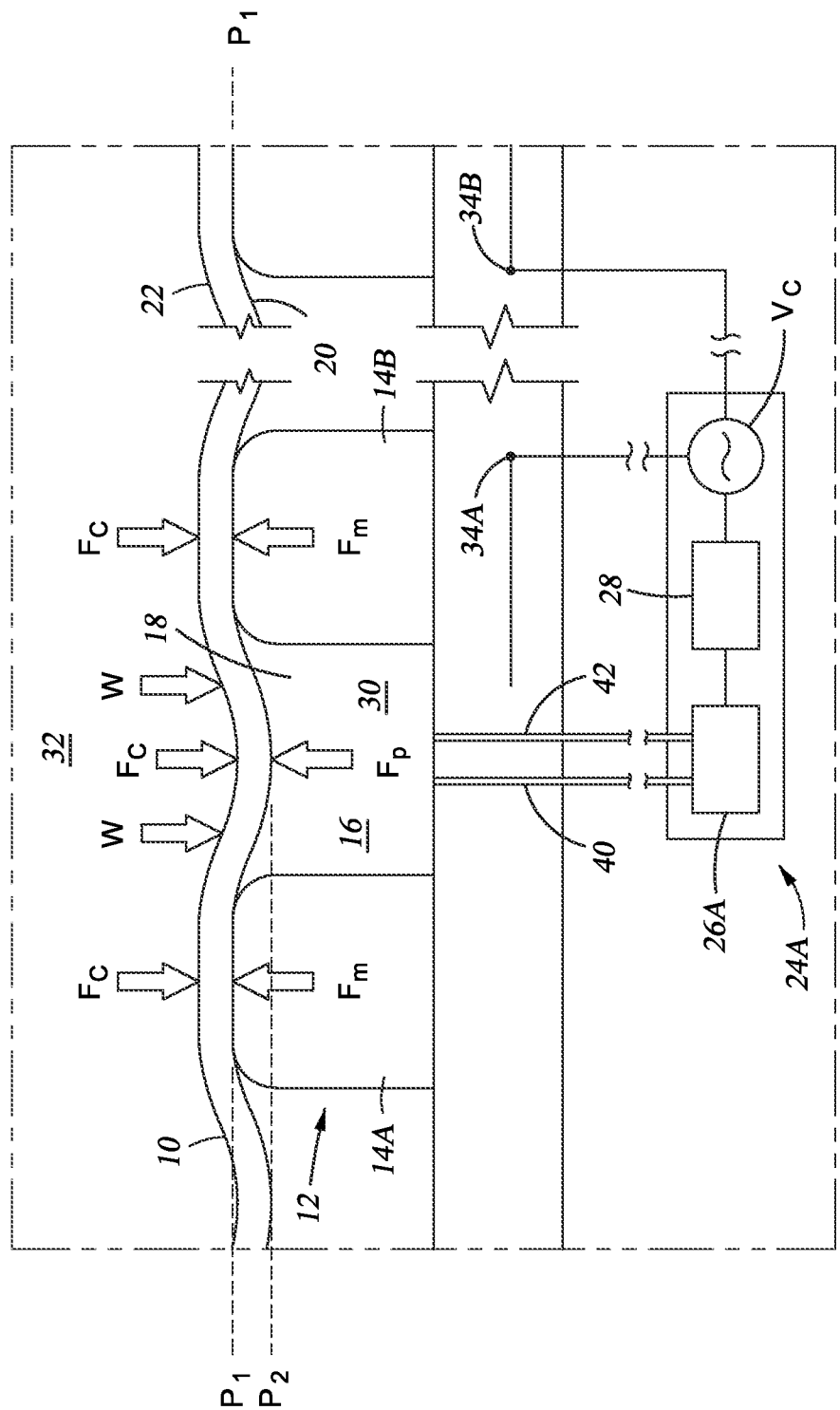
FIG. 1B is a close-up side view of the workpiece secured to the electrostatic chuck of FIG. 1A.

FIG. 1B is a close-up sectional view of the workpiece 10 secured to the exemplary electrostatic chuck 12 of FIG. 1A with the clamping force Fc. The clamping force Fc was not applied in FIG. 1A. Once the mesas 14A, 14B abut against the workpiece 10, the clamping force Fc may be applied to the workpiece 10 to secure the workpiece 10 to the electrostatic chuck 10. The clamping force Fc is an attraction force between opposite electric charges. The opposite electric charges are provided by a voltage difference ("clamping voltage Vc") of the electrodes 34A, 34B as controlled by the control system 24, and the electrical charges distributed on the backside 20 of the workpiece 10 in response to the electric charges of the electrodes 34A, 34B on a bipolar electrostatic chuck configuration. It is noted that on a monopolar electrostatic chuck configuration (not shown), only one of the electrodes 34A, 34B would be provided. The clamping force Fc pulls the workpiece 10 towards the mesas 14A, 14B and together with the contact with the mesas 14A, 14B may help prevent movement of the workpiece 10 with respect to the electrostatic chuck 12.

There are other forces ("secondary forces") applied to the workpiece 10 when the workpiece 10 is secured to the electrostatic chuck 12. These other forces supplement or detract from the clamping force Fc. For example, a pressure difference force Fp may form between the recess at the backside 20 of the workpiece 10 and an outer space 32 at the frontside 22 of the workpiece 10. It is noted that a pressure difference force Fp may be formed as the workpiece 10 closes the recess 16 from the outer space 32 and a gas 30 is added or evacuated from the recess 16. In FIG. 1B, the situation where the gas 30 is added into the recess 16 is depicted, and the pressure difference force Fp is directed upon the backside 20 of the workpiece 10 to oppose the clamping force Fc. It is also mentioned briefly that a weight W of the workpiece 10 may also supplement or detract from the clamping force Fc. In FIG. 1B the electrostatic chuck 12 is orientated below the workpiece 10 and the weight W supplements the clamping force Fc. It is understood that the orientation of the electrostatic chuck 12 may change with respect to the workpiece 10. In this manner, the secondary forces applied to the workpiece 10, including the pressure difference force Fp and the weight W may also supplement or detract from the clamping force Fc and may be considered by the control system 24 when determining the clamping force Fc from the deflection Z of the workpiece 10.

With further reference to FIG. 1B, it is noted that the clamping force Fc may be directed toward the mesas 14A, 14B and also towards the recess 16. However, the force Fm which the mesas 14A, 14B use to support the workpiece 10 may only be directed at points of contact between the mesas 14A, 14B and the workpiece 10. Accordingly, there will be a deflection Z of the workpiece 10 into the recess 16 as long as the clamping force Fc overcomes any potential opposing force contribution of the secondary forces, for example, the weight W and the pressure difference force Fp.

Figure 1C:
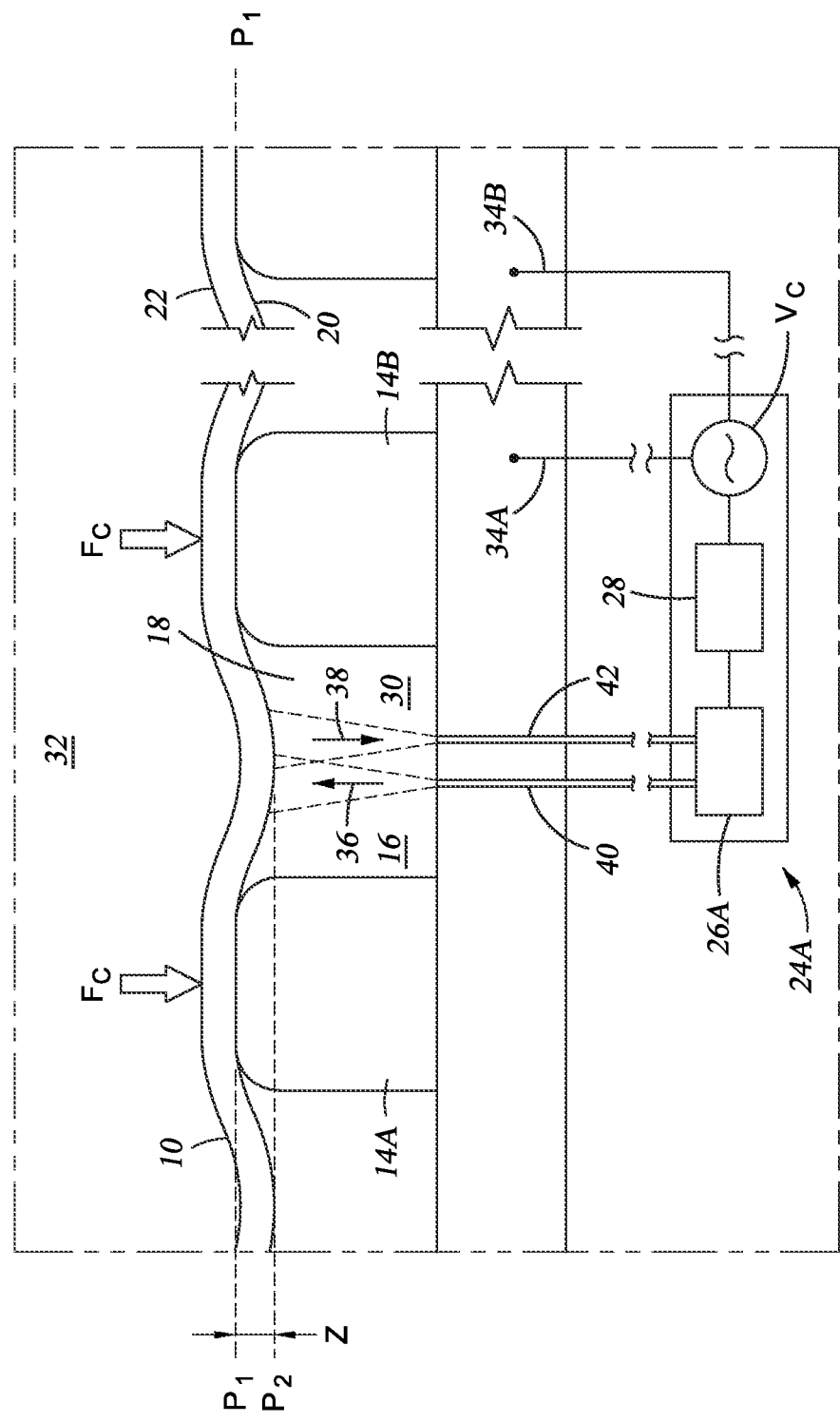
FIG. 1C is a close-up side sectional view of the workpiece secured to the electrostatic chuck of FIG. 1B with the sensor of the control system measuring the deflection of the workpiece into the recess.

Now that the clamping force Fp and the deflection Z of the workpiece in response to the clamping force Fp have been introduced, an approach using the control system 24A to control the clamping force Fp is discussed below. FIG. 1C depicts a control system 24A configured to control the clamping force $F_C$ by applying a clamping voltage Vc to the electrodes 34A, 34B based on a measurement of a deflection Z of the workpiece 10 into the recess 16. The control system 24A includes a sensor 26A and a controller 28. In one embodiment, the sensor 26A may be a MTI-2100 Fotonic Sensor manufactured by MTI Instruments Incorporated of Albany, N.Y. In other embodiments the sensor 26A may comprise a proximity sensor and/or an interferometric sensor. The sensor 26A may be configured to measure the deflection Z of the workpiece 10 into the recess 16 as discussed in more detail later. The controller 28 may be configured to determine the clamping force Fc applied to the workpiece 10 based on the deflection Z determined by the sensor 26A. In this manner, the controller 28 may adjust the clamping force Fc using the clamping voltage Vc to reach and maintain a desired clamping force Fc which may minimize damage to the workpiece 10 from the electrostatic chuck 12.

FIG. 1C depicts the sensor 26A of the control system 24A determining the deflection Z of the workpiece 10 into the recess 16. When the clamping force Fc is applied, the workpiece 10 may be tangent to a geometric plane P2 at a location of the maximum deflection Z. The deflection Z may be, for example, seventy (70) microns. When the deflection Z is determined as a change in position from the geometric plane P1 to the geometric plane P2, the clamping force Fc may be determined and controlled to minimize damage to the workpiece 10 from the electrostatic chuck 12 while ensuring the workpiece 10 is secured thereto.

In order to determine the deflection Z of the workpiece 10, the sensor 26A may be configured to emit a radiation 36 to the workpiece 10 and measure a portion 38 of the radiation 36 reflected. A surface of the workpiece 10 upon which the radiation 36 is reflected may be the backside 20 of the workpiece 10, although depending on the transparency and composition of the workpiece 10 the frontside 22 of the workpiece 10 could alternatively reflect the portion 38 of the radiation 36. The sensor 26A may include a radiation emitter 40 to emit the radiation 36 and a radiation detector 42 to measure the portion 38 of the radiation 36 reflected. The radiation 36 may be, for example, electromagnetic radiation having a wavelength between 600 and 1700 nanometers.

Figure 2A:
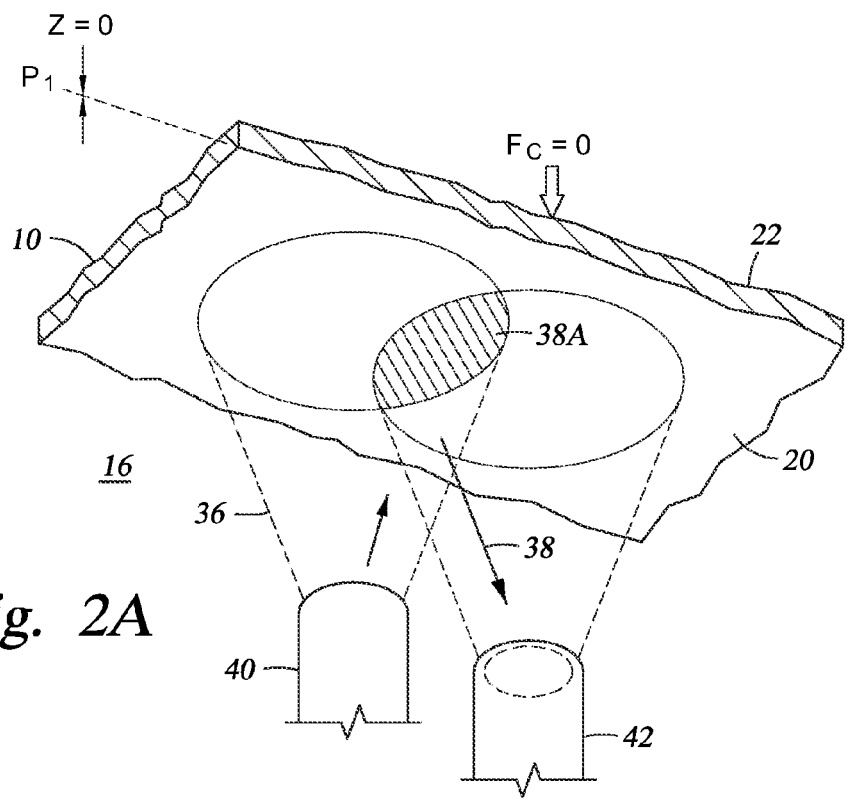
FIGS. 2A and 2B are a close-up perspective views of the sensor of FIG. 1C reflecting respective portions of radiation.
Figure 2B:
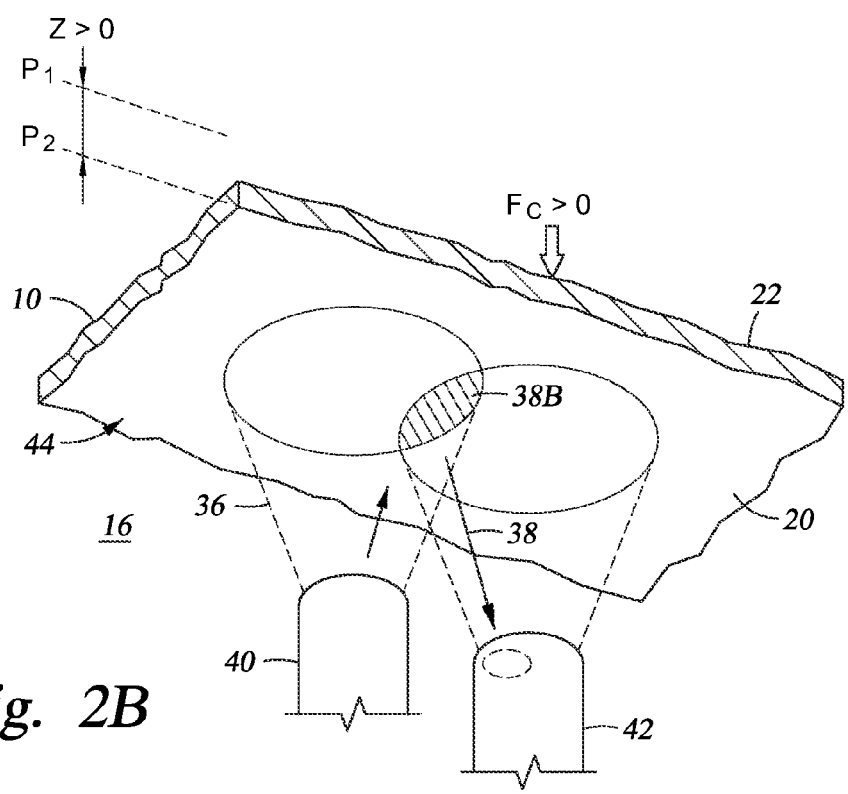
Figure 2C:
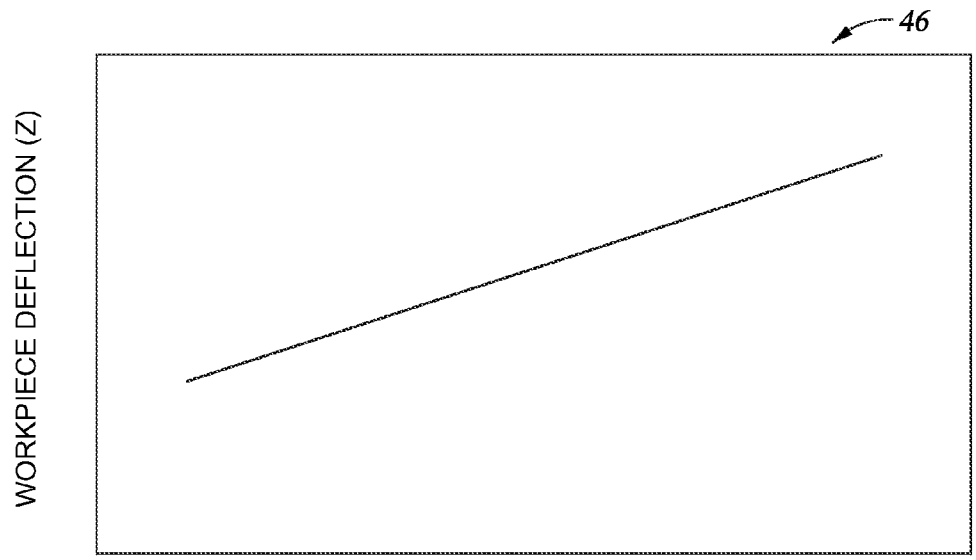
FIG. 2C is a graph of workpiece deflection versus a change in a portion of reflected radiation detected.

FIGS. 2A and 2B are close-up perspective views of the sensor 26A of FIG. 1C detecting the portion 38 of the radiation 36 before and after, respectively, the clamping force Fc being applied to the workpiece 10. Specifically, the radiation 36 may be emitted by the radiation emitter 40 and reflected from the workpiece 10. The portion 38 of the radiation 36 reflected and detected by the radiation detector 42 when the clamping force Fc is unapplied is depicted in FIG. 2A as portion 38A. In FIG. 2B when the clamping force Fc is applied the workpiece 10 accommodates the deflection Z by taking on a more convex shape 44 which changes the portion 38 of the radiation 36 detected by the radiation detector 42 as depicted by portion 38B. FIG. 2C is a graph of the deflection Z of the workpiece 10 versus a change in the portion of the radiation 36 reflected and detected. A resulting relationship 46 indicates that the deflection Z determined may increase with an increasing change in the portion 38 of the radiation 36 detected. In this manner, the deflection Z of the workpiece 10 may be determined by the control system 24A so that the clamping force Fc may be controlled to prevent damage the workpiece 10 yet be sufficient to secure the workpiece 10 to the electrostatic chuck 12.

Figure 3:
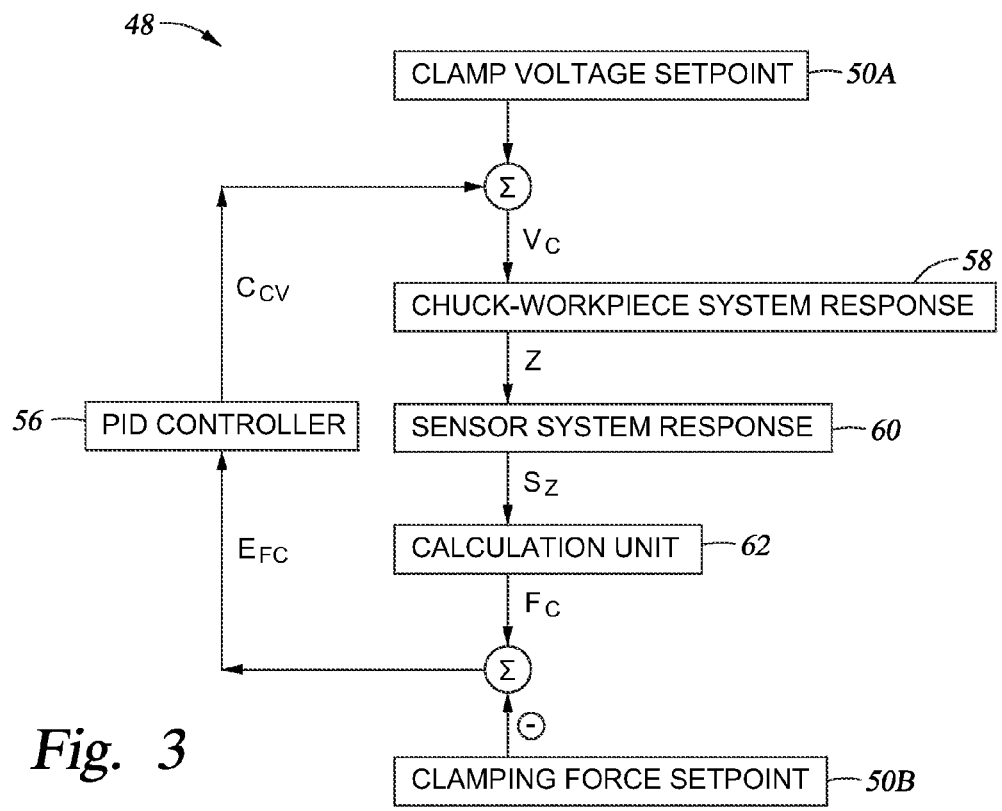
FIG. 3 is a schematic flowchart diagram of the control system of FIGS. 1A through 1C comprising a PID controller to determine a clamping force correction from a clamping voltage error.

FIG. 3 is a schematic flowchart diagram 48 of the control system 24A of FIGS. 1A through 1C illustrating an exemplary operation of the control system 24A. The embodiment of the control system 24A may include nominal values of a clamping voltage setpoint 50A and a clamping force setpoint 50B as inputs. The clamping voltage setpoint 50A and the clamping force setpoint 50B may serve as default values and/or initial values as the clamping force Fc may be initially applied as part of a closed loop system.

Given these inputs, the operation of the control system 24A may include determining the clamping voltage Vc applied to the electrodes 34A, 34B by adding the clamping voltage setpoint 50A to a clamping voltage correction $C_{CV}$ output from a proportional-integral-derivative (PID) controller 56 of the control system 24A. The clamping voltage Vc is converted to the deflection Z of the workpiece 10 by a chuck-workpiece system response 58 comprising the workpiece 10 supported by the electrostatic chuck 12. The deflection Z may be converted to a measured deflection signal Sz by a sensor system response 60 provided by the sensor 26A. The clamping force Fc may be determined by a calculation unit 62 using the measured deflection signal Sz. A clamping force error $E_{FC}$ may then be determined by calculating a difference between the clamping force Fc and the clamping force setpoint 50B. The PID controller 56 may use the clamping force error $E_{FC}$ to determine the clamping voltage correction $C_{CV}$ to complete the closed loop system. In this manner, the clamping force Fc may be controlled by the control system 24A to reach and maintain the clamping force setpoint 50B to minimize damage to the workpiece 10 while securing the workpiece 10 to the electrostatic chuck 12.

Figure 4:
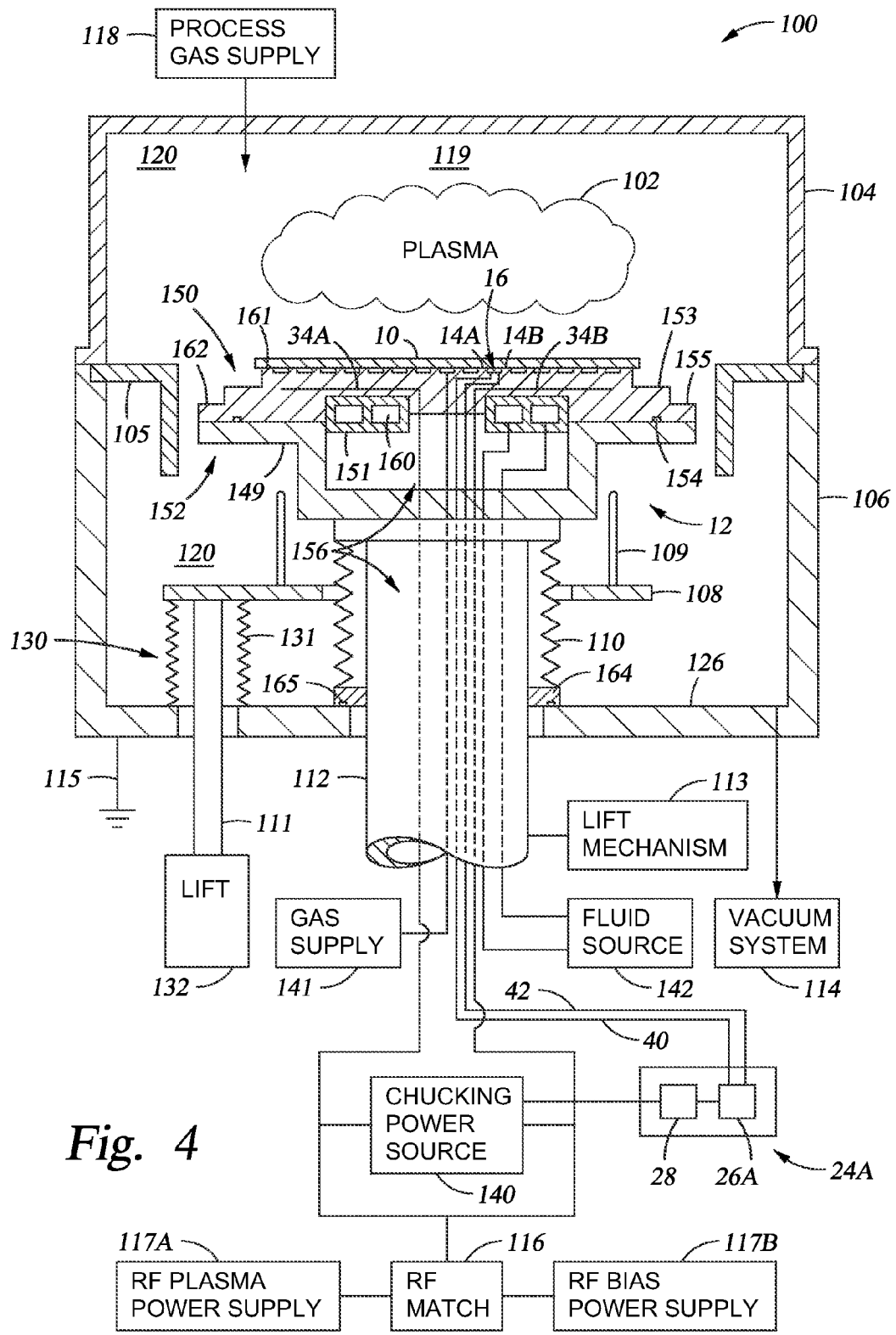
FIG. 4 is a schematic view of the electrostatic chuck of FIGS. 1A through 1C installed within an exemplary plasma processing chamber.

In order to illustrate one embodiment of the electrostatic chuck 10 of the control system 24A, FIG. 4 depicts a schematic view of the electrostatic chuck 12 of FIGS. 1A through 1C installed within an exemplary plasma processing chamber 100. In one embodiment, the plasma processing chamber is a sputter etch processing chamber or a plasma etch system. However, other types of processing chambers, such as physical vapor deposition (i.e., sputtering) chambers, for example, may also be used to practice the embodiments disclosed herein.

The chamber 100 is a vacuum chamber which may be suitably adapted to maintain sub-atmospheric pressures within a chamber interior volume 120 during substrate processing. The chamber 100 includes a chamber body 106 covered by a dome 104 which encloses a processing volume 119 located in the upper half of the chamber interior volume 120. The chamber 100 may also include one or more shields 105 circumscribing various chamber components to prevent unwanted reaction between such components and ionized process material. The chamber body 106 and the dome 104 may be made of metal, such as aluminum.

Within the chamber interior volume 120 is disposed the electrostatic chuck assembly 12 for supporting and chucking (applying a clamping force Fc to) the workpiece 10, such as a semiconductor wafer, for example. The electrostatic chuck assembly 12 comprises a puck 150 upon which the workpiece 10 rests, a cooling plate 151, and a support base 152. The puck may comprise the mesas 14A, 14B and the recess 16. The support base 152 may include a support housing 149, bellows assembly 110 and a hollow support shaft 112. The support shaft 112 may be coupled to a lift mechanism 113 which may provide vertical movement of the electrostatic chuck assembly 12 between an upper, processing position as shown in FIG. 4 and a lower, transfer position (not shown). The bellows assembly 110 may be disposed about the support shaft 112 and may be coupled between the support base 152 and a bottom surface 126 of the chamber 100 to provide a flexible seal that allows vertical motion of the electrostatic chuck assembly 124 while preventing loss of vacuum from within the chamber 100. The bellows assembly 110 may also include a lower bellows flange 164 in contact with an o-ring 165 which contacts bottom surface 126 to help prevent loss of the chamber vacuum.

The puck 150 may include an electrically insulative puck base 162 with the electrodes 34A, 34B embedded therein and which are electrically connected to a chucking power source 140, such as a DC power supply, and controlled by the control system 24A. In another example, the puck 150 may include one electrode 34A or more than two electrodes 34A, 34B for substrate chucking. For the case of two electrodes, the electrodes 34A, 34B may each be thin semicircular or "D" shaped plates, with each of the electrodes 34A, 34B attached to one terminal of the DC power supply. For a single electrode 34A, the electrode 34A may be a thin disk attached to one terminal of a DC power supply (the other DC terminal being attached to ground potential). However, the one or more electrodes 34A, 34B may have any suitable shape, which may include rings, wedges, strips, and so on. The electrodes 34A, 34B may be made of any suitable electrically conductive material, such as a metal or metal alloy, for example.

The electrodes 34A, 34B may be coupled to a radio frequency (RF) plasma power supply 117A and an RF bias power supply 117B through one or more RF matches 116. The RF plasma power supply 117A provides power to form a plasma 102, and the RF bias power supply 117B applies an RF bias to the workpiece 10. In another embodiment, the RF power supplies are not coupled to the electrostatic chuck assembly 12.

The puck 150 may include a first flange 153 and a second flange 155. The first flange 153 may be used to support an edge ring (not shown) to reduce edge effects during substrate etching, and the second flange 155 may be used to couple the puck 150 to the support base 152. In another embodiment, the puck 150 may include only a first flange 153 but no second flange 155.

The puck 150 also may include the mesas 14A, 14B as discussed above which support the workpiece 10, and between the mesas 14A, 14B are the recess 16 (or gas grooves) which may be in fluid communication with a gas supply 141. The gas supply 141 may provide a heat transfer gas which may flow between the backside 20 of the workpiece 10 and the puck 150 in order to help regulate the rate of heat transfer between the puck 150 and the workpiece 10. In one example, the heat transfer gas may comprise an inert gas, such as argon. The heat transfer gas may be delivered to the recess 16 (or gas grooves) through one or more holes (not shown) in the puck 150 which are in fluid communication with one or more of the recess 16 (or gas grooves). The puck 150 may also have an outer peripheral ring 161 which contacts the workpiece 10 near its edge and which may help control the amount of heat transfer gas which escapes from behind the workpiece 10.

Temperature regulation of the workpiece 10 may be further facilitated by multiple cooling channels 160 which are disposed in cooling plate 151, and the cooling channels 160 are coupled to and in fluid communication with a fluid source 142 which provides a coolant fluid, such as water, although any suitable coolant fluid, gas or liquid, may be used. In another embodiment, the puck 150 may also include heating elements disposed between the electrodes 34A, 34B and the cooling plate 151. Additionally, the temperature of the puck 150, the cooling plate 151, and/or other components of the electrostatic chuck 12 may be monitored using one or more temperature sensors (not shown), such as thermocouples and the like, coupled to one or more temperature monitors. In one example, the puck 150 is coupled to at least one thermocouple for temperature monitoring.

The electrostatic chuck assembly 12 includes the cooling plate 151 which is coupled to the puck 150 using bolts (not shown) or other suitable fastening devices. The cooling plate 151 may be partially recessed within the puck 150 to provide better thermal coupling with the puck 150 and the workpiece 10. A thermally conductive material may also be provided between the puck 150 and cooling plate 151 to further improve thermal coupling between the puck 150 and cooling plate 151. In another embodiment, a bonding agent is used to bond the cooling plate 151 to the puck 150.

The puck 150 is coupled to the support housing 149 of support base 152 using multiple bolts (not shown) disposed around the second flange 155 of puck 150. One or more o-rings 154 are located within o-ring grooves between the puck 150 and support housing 149 to provide a vacuum seal between the chamber interior volume 120 and interior volumes 156 within the electrostatic chuck assembly 124. The interior volumes 156 may include open spaces within the support housing 149 and within the hollow support shaft 112 for routing conduits and wiring, and the interior volumes 156 are in fluid communication with atmospheric pressure external to chamber 100. In the present embodiment, the puck 150 is detachable from the support housing 149 so that the puck 150 may be replaced without replacing the support housing 149 and support base 152. In another embodiment, the puck 150 and the support housing 149 may be bonded together to form an integral unit.

The support shaft 112 and bellows assembly 110 are coupled to the support housing 149 to form support base 152. In one embodiment, the support shaft 112 and bellows assembly 110 are welded to the support housing 149. In another embodiment, the support shaft 112 and bellows assembly 110 may form a separate assembly which is bolted to the support housing 149. In yet another embodiment, the electrostatic chuck assembly 12 may be suitably adapted so that support shaft 112 and bellows assembly 110 are coupled directly to cooling plate 151 and no support housing 149 is used.

A substrate lift 130 may include lift pins 109 mounted on a platform 108 connected to a shaft 111 which is coupled to a second lift mechanism 132 for raising and lowering the substrate lift 130 so that the workpiece 10 may be placed on or removed from the puck 150. The electrostatic chuck 12 may include thru-holes (see 204 in FIG. 5) to receive the lift pins 109. A bellows assembly 131 is coupled between the substrate lift 130 and bottom surface 126 to provide a flexible seal which maintains chamber vacuum during vertical motion of the substrate lift 130.

The chamber 100 is coupled to and in fluid communication with a vacuum system 114 which includes a throttle valve (not shown) and vacuum pump (not shown) which are used to exhaust the chamber 100. The pressure inside the chamber 100 may be regulated by adjusting the throttle valve and/or vacuum pump. The chamber 100 is also coupled to and in fluid communication with a process gas supply 118 which may supply one or more process gases, such as argon, to the chamber 100 for etch processing.

To create a plasma 102 for sputter etching the workpiece 10, the electrodes 34A, 34B are coupled to the RF plasma power supply 117A and the RF bias power supplies 117B through the one or more RF matches 116 to form plasma 102 and apply a bias to the workpiece 10 within the chamber 100. The electrodes 34A, 34B function as an RF cathode which is electrically isolated from the chamber body 106 and dome 104, and both the chamber body 106 and dome 104 are connected to a ground 115. Process gas, such as argon, is introduced into the chamber 100 from process gas supply 118 and the gas pressure is adjusted to a preset value for plasma ignition. The plasma 102 is ignited in the processing volume 119 through capacitive coupling when RF power is delivered to the electrodes 34A, 34B from the RF plasma power supply 117A. The RF match 116 may be adjusted or preset to improve the efficiency of power transfer from the RF plasma power supply 117A to the plasma 102. The RF bias power supply 117B applies a bias to the electrodes 34A, 34B so that positively charged ions in the plasma 102 are accelerated to the frontside 22 of the workpiece 10 and the frontside 22 is sputter etched.

The RF plasma power supply 117A and RF bias power supply 117B may provide power at a frequency within a range of about 0.5 MHz to about 60 MHz, or more preferably near about 2 MHz and about 13.56 MHz. A lower frequency may be used to drive the bias and the ion energy and a higher frequency may be used to drive the plasma 102.

Figure 5:
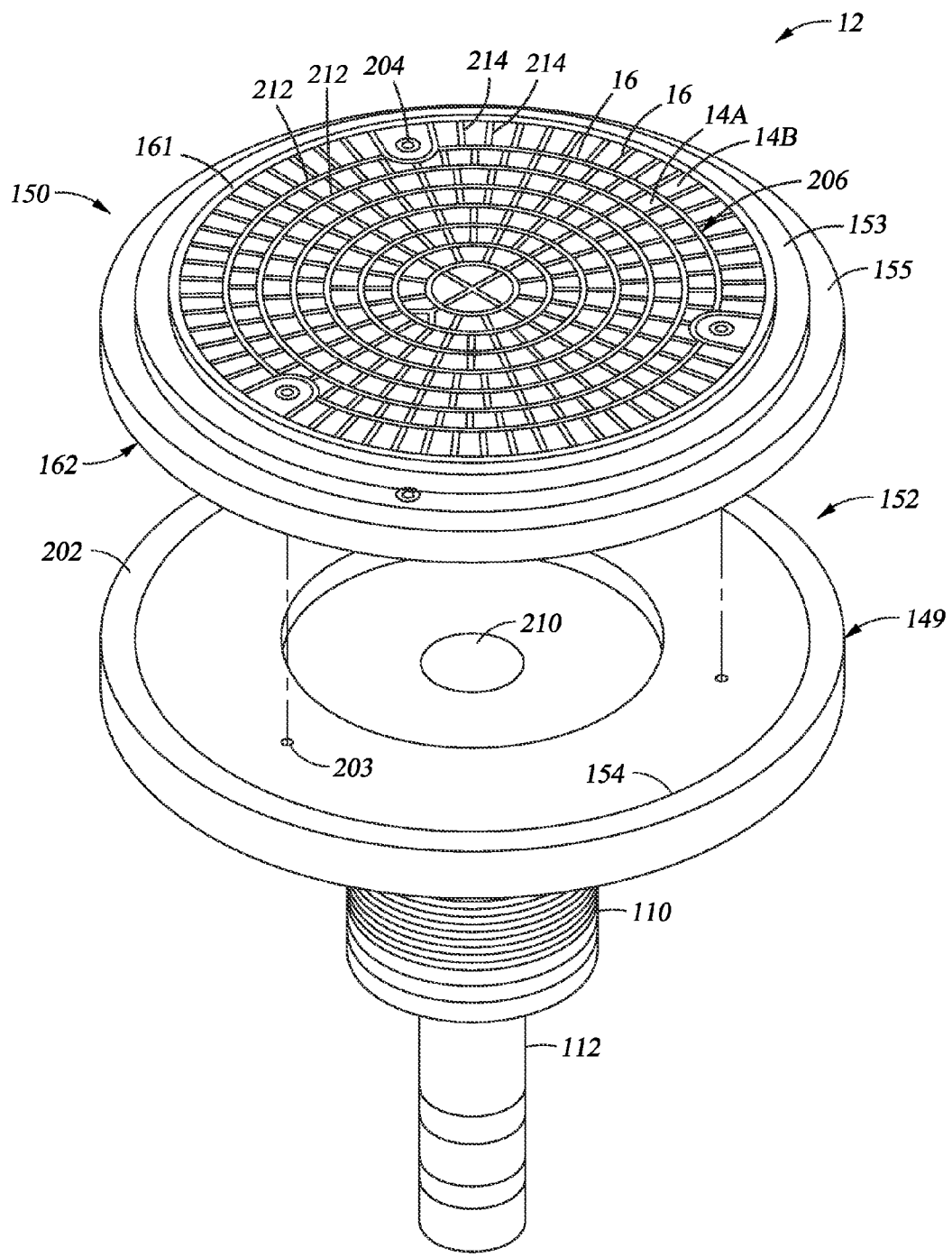
FIG. 5 is a top perspective exploded view of the electrostatic chuck of FIG. 1A illustrating the recess formed by mesas of the electrostatic chuck.

FIG. 5 depicts an exploded view of one embodiment of the electrostatic chuck assembly 12. For clarity, electrical wiring and fluid-carrying conduits which are routed through a shaft thru-hole 210 in support shaft 112 are not shown. The support housing 149 includes a flange 202 with flange thru-holes 203 which are in alignment with lift pin holes 204 so that lift pins 109 may raise or lower the workpiece 10 from a frontside surface 206 of the puck 150. The o-ring 154 is disposed within an o-ring groove (not shown) on flange 202 so that when puck 150 is coupled to the support housing 149 a vacuum seal may be formed.

The frontside surface 206 may be bounded by the outer peripheral ring 161 and may include a plurality of raised wedge-shaped protrusions introduced earlier as the mesas 14A, 14B defined by intersecting one or more recess 16 (or gas grooves) which distribute a heat transfer gas as described above. The recess 16 may comprise radial channels 214 which intersect with circular channels 212. The recess 16 may also comprise a plurality of channels which intersect at right angles to form a grid-like pattern. Alternately, radial patterns may be combined with grid and circular patterns, but other geometries may also be used for the pattern of the recess 16.

The mesas 14A, 14B which are disposed between intersecting one or more recesses 16 may comprise square or rectangular blocks, cones, wedges, pyramids, posts, cylindrical mounds, or other protrusions of varying sizes, or combinations thereof that extend up from the puck 150 and support the workpiece 10.

The puck base 162 may comprise at least one of aluminum oxide, aluminum nitride, silicon oxide, silicon carbide, silicon nitride, titanium oxide, zirconium oxide, although other material may also be used. The puck base 162 may be a unitary monolith of ceramic made by hot pressing and sintering a ceramic powder, and then machining the sintered form to form a final shape of the puck 150.

Figure 6A:
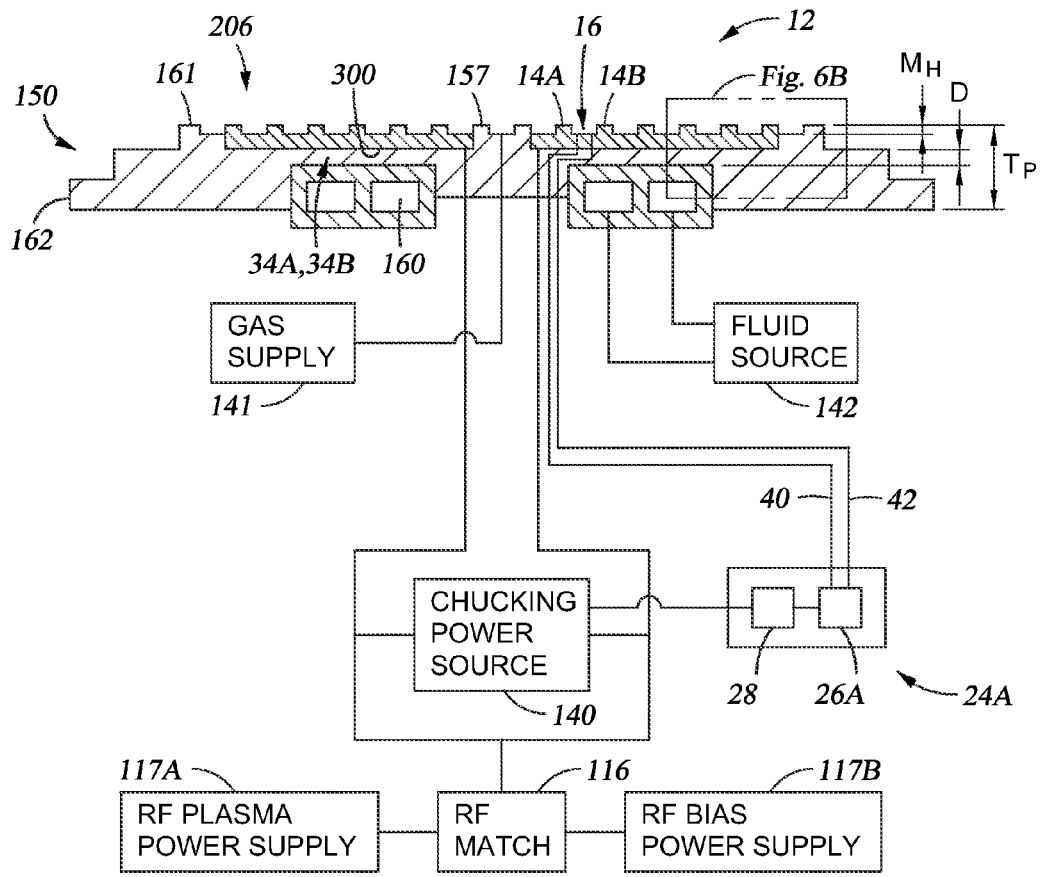
FIGS. 6A and 6B are a schematic cross sectional view and a close-up view, respectively, of the electrostatic chuck of FIG. 5.

FIG. 6A is a schematic cross-sectional detail view of one embodiment of the electrostatic chuck assembly 12 shown in FIG. 4. Two of the electrodes 34A, 34B are partially embedded into the electrically insulative puck base 162 on the frontside surface 206 of the puck 150. For clarity, the workpiece 10 is not shown. In this context, "partially embedded" means that the chucking electrodes 34A, 34B are not completely surrounded or enclosed by the material of puck base 162, and one side of each of the electrodes 34A, 34B forms part of frontside surface 206, which may be coated with a dielectric material. In another embodiment, one electrode 34A may be used. In yet another embodiment, the puck 150 may include more than the two electrodes 34A, 34B.

The puck base 162 provides a means for electrically isolating the electrodes 34A, 34B from each other and the workpiece 10, as well as providing a thermal conduction path and mechanical support for the electrodes 34A, 34B and other components of puck 150. The puck base 162 has a thickness "D" between the electrodes 34A, 34B and cooling plate 151.

The material used for the electrodes 34A, 34B may be suitably chosen so that coefficient of thermal expansion (CTE) for the electrode material substantially matches the CTE of the electrically insulative puck base 162 material in order to minimize CTE mismatch and avoid thermo-mechanical stresses which may damage the puck 150 during thermal cycling. In one embodiment, an electrically conductive metal matrix composite (MMC) material is used for the electrodes 34A, 34B. The MMC material comprises a metal matrix and a reinforcing material which is embedded and dispersed throughout the matrix. The metal matrix may comprise a single metal or two or more metals or metal alloys. Metals which may be used include but are not limited to aluminum (Al), magnesium (Mg), titanium (Ti), cobalt (Co), cobalt-nickel alloy (CoNi), nickel (Ni), chromium (Cr), gold (Au), silver (Ag) or various combinations thereof.

The reinforcing material may be selected to provide the desired structural strength for the MMC, and may also be selected to provide desired values for other properties of the MMC, such as thermal conductivity and CTE, for example. Examples of reinforcing materials which may be used include silicon (Si), carbon (C), or silicon carbide (SiC), but other materials may also be used.

The MMC material for the electrodes 34A, 34B is preferably chosen to provide the desired electrical conductivity and to substantially match the CTE of the puck base 162 material over the operating temperature range for the electrostatic chuck assembly 124. In one embodiment, the temperature may range from about 20 degrees Celsius to about 400 degrees Celsius. In one embodiment, matching the CTEs comprises selecting the MCC material so that the MCC material comprises at least one material which is also used in the puck base 162 material. In one embodiment, the puck base 162 comprises aluminum oxide (Al2O3). In one embodiment, the MMC material comprises aluminum (Al) and silicon (Si). In one embodiment, the MMC composition comprises about 13 wt % Al (percent composition by weight) and about 87 wt % Si. In another embodiment, the MMC composition comprises about 50 wt % Al and about 50 wt % Si. In yet another embodiment, the MMC composition comprises about 30 wt % Al and about 70 wt % Si. In another embodiment, the MMC may comprise at least three materials, such as aluminum silicon carbide (AlSiC) or titanium silicon carbide (TiSiC), for example.

The constituent materials and composition percentages of the MMC may be selected to provide an engineered material which meets desirable design objectives. For example, by suitably selecting the MCC material to closely match the CTEs of the electrodes 34A, 34B and puck base 162, the thermo-mechanical stresses within the puck base 162 are reduced which may allow the use of a less massive or thinner puck base 162 since the base thickness TP is determined in part by the structural strength required to prevent cracking or fracturing of the puck base 162 during normal temperature cycling. The reduction in thickness of the puck base 162 may provide a reduction in the cost of the puck 150. Additionally, MCC materials may be less expensive to use than other materials for some applications. For example, molybdenum may be used for the electrodes 34A, 34B when the puck base 162 comprises Al$_2$O$_3$ since molybdenum has a CTE which may provide an acceptable match to the CTE of Al$_2$O$_3$, but molybdenum may be significantly more expensive to use than an MCC material which provides an equivalent or closer CTE match.

With continued reference to FIG. 6A, the electrode bottom surface 300 of each of the electrodes 34A, 34B is bonded to the puck base 162. Diffusion bonding may be used as the method of bonding, but other bonding methods may also be used. In one embodiment, aluminum foil (not shown) approximately 50 microns (micrometers) thick is placed between the electrode bottom surface 300 and puck base 162 and pressure and heat are applied to form a diffusion bond between the aluminum foil and Al—Si MMC chucking electrode 34A, 34B and between the aluminum foil and Al2O3 puck base 162. In another embodiment, the electrodes 34A, 34B are directly bonded to the puck base 162 using direct diffusion bonding which does not require the use of an interlayer material, such as aluminum foil.

After bonding the electrodes 34A, 34B to the puck base 162, the electrodes 34A, 34B and puck base 162 may be machined to form the mesas 14A, 14B, recesses 16 (or gas grooves), outer peripheral ring 161, and/or other puck 150 features at the frontside surface 206, although some of the aforementioned features may also be machined prior to electrode bonding. In one embodiment, the mesas 14A, 14B, and the recess 16 (or gas grooves) are formed in electrodes 34A, 34B at the frontside surface 206, as shown in FIG. 6A, and the mesa height MH ranges from about 200 microns to about 1000 microns. Each of the mesas 14A, 14B may also have a small protrusion or bump (not shown) to minimize the total contact area between the mesas 14A, 14B and the workpiece 10.

Figure 6B:
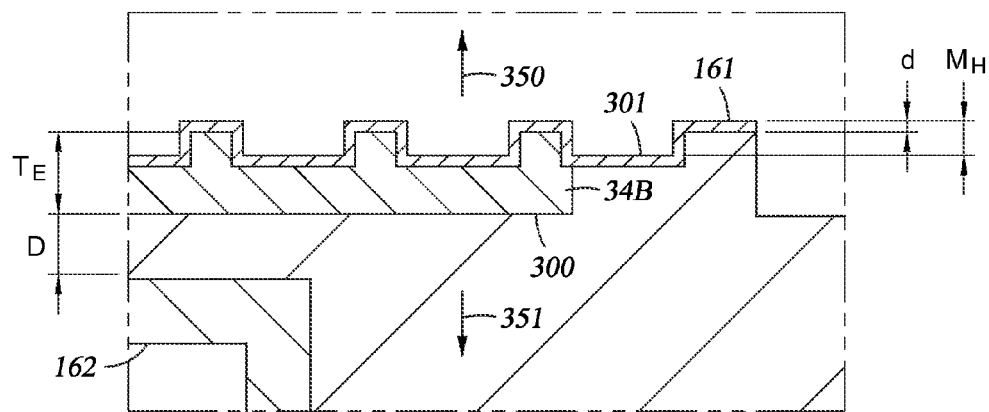

FIG. 6B is a schematic cross-sectional detail view of the electrostatic chuck assembly 12 shown in FIG. 6A according to one embodiment. The puck base 162 electrically isolates the electrodes 34A, 34B from each other. To enable electrostatic chucking of the workpiece 10 wherein the workpiece 10 is secured to the electrostatic chuck 12 with the clamping force Fc, the electrodes 34A, 34B are also electrically insulated from the workpiece 10. In one embodiment, the electrodes 34A, 34B and features formed thereon are surface treated or coated on frontside surface 206 to provide an electrically insulating, dielectric layer 301 between the electrodes 34A, 34B and the workpiece 10 (not shown in FIG. 6B). In another embodiment, the dielectric layer 301 comprises a dielectric material with a CTE that substantially matches the CTE of the MCC material used for the electrodes 34A, 34B, and the dielectric material is suitably selected to provide good adhesion to the electrodes 34A, 34B and the puck base 162. In one embodiment, the dielectric layer 301 comprises a material with a CTE that substantially matches the CTE of the puck base 162.

With continued reference to FIG. 6B, dielectric material is deposited conformally onto the electrodes 34A, 34B to form a thin, uniform dielectric layer 301 or coating over the electrodes 34A, 34B and features formed thereon, such as the mesas 14A, 14B and the recess 16 (gas grooves), for example. The dielectric material is applied as a blanket coating which covers the electrodes 34A, 34B and portions of the puck base 162 on frontside surface 206 of the puck 150. In another embodiment, the dielectric layer 301 comprises two or more layers, each layer deposited sequentially as a blanket coating.

The dielectric layer 301 may comprise one of boron nitride, aluminum oxide (Al2O3), diamond-like carbon (DLC), DLC matrix composite materials, Dylyn®, or a combination thereof, although other types of dielectric materials may be used. In another embodiment, the dielectric layer 301 provides a hardness of between about 10 GPa (giga-pascals) to about 25 GPa. In one embodiment, the dielectric layer 301 has a coefficient of static friction which ranges from about 0.15 to about 5.0. In another embodiment, the dielectric layer 301 has a coefficient of static friction which ranges from about 0.05 to about 0.2. The dielectric layer 301 may be deposited by arc-spraying, chemical vapor deposition (CVD), sputtering, or plasma-assisted CVD, but other deposition methods may also be used.

The dielectric layer 301 has a thickness "d" which may range from about one (1) micron to about 1000 microns, but other thicknesses may be used. In one embodiment, the thickness "d" ranges from about 200 microns to about 800 microns. In another embodiment, the thickness "d" ranges from about one (1) micron to about ten (10) microns. The electrode thickness TE may be suitably chosen to provide sufficient thickness for machining features such as the mesas 14A, 14B and the recess 16 (gas grooves) and for providing the desired mesa height MH following deposition of dielectric layer 301. In one embodiment, the electrode thickness TE is greater than about five-hundred (500) microns.

Figure 7A:
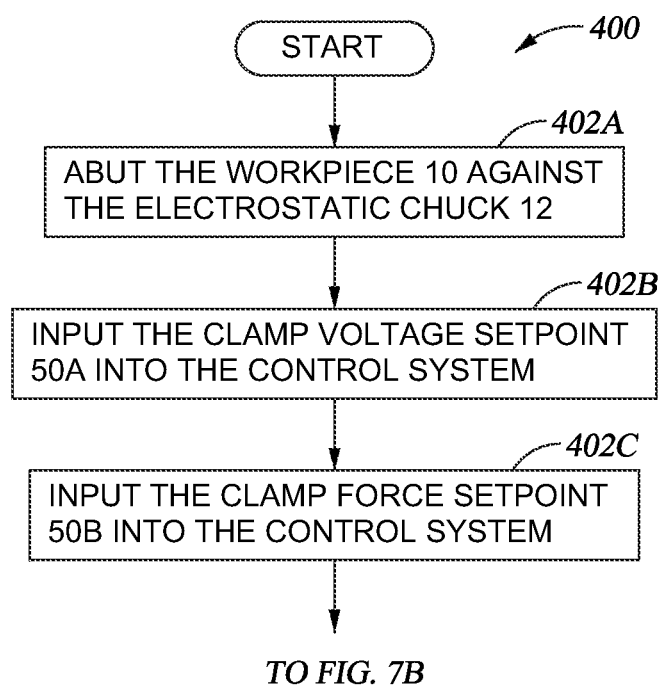
FIGS. 7A and 7B depict a flowchart diagram of an exemplary method to control the clamping force applied to the workpiece using the control system of FIGS. 1A through 1C.
Figure 7B:
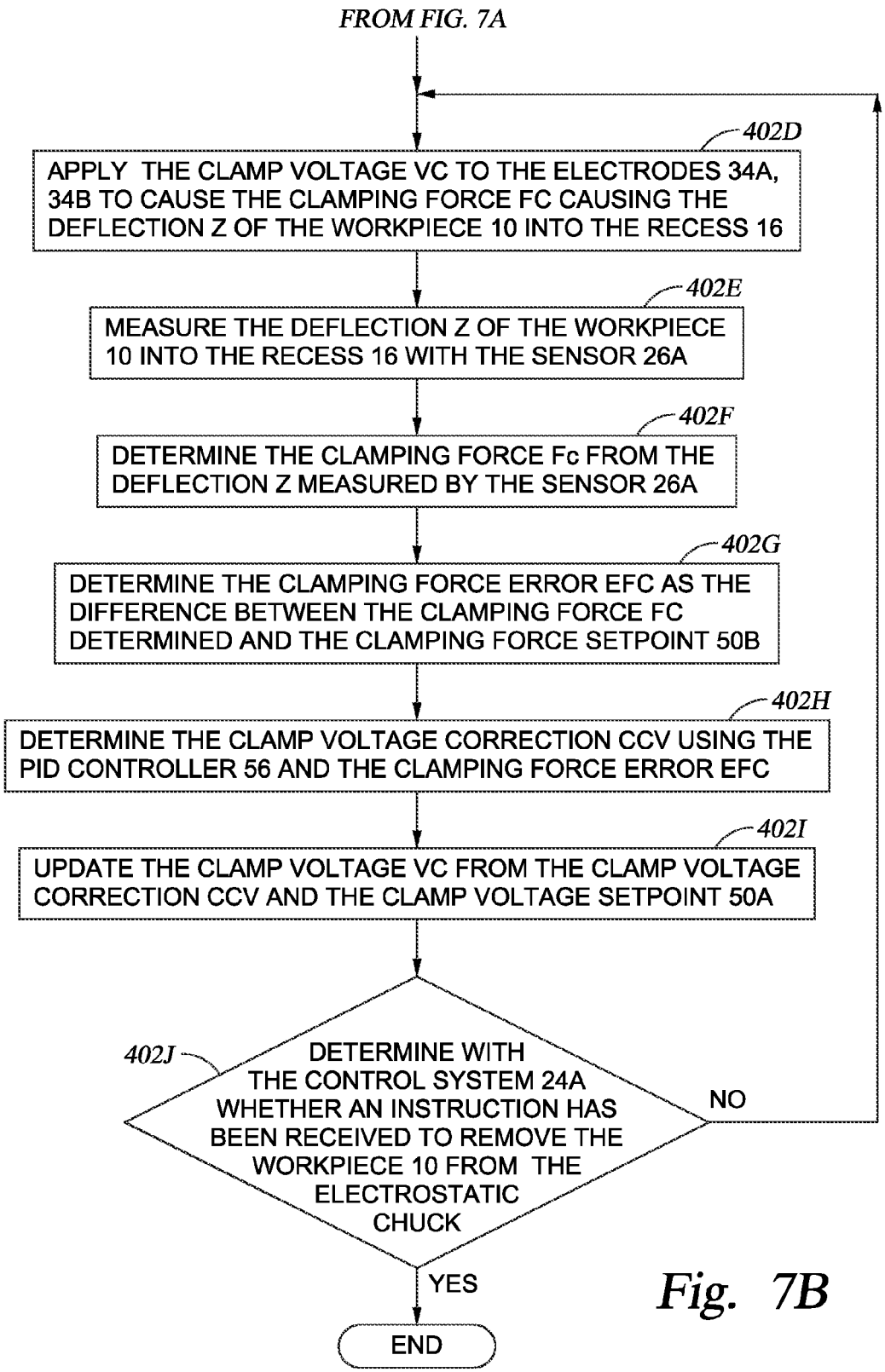

Now that an exemplary installation of the control system 24A with the electrostatic chuck 12 has been introduced within the chamber 100, FIGS. 7A and 7B depicts a flow-chart diagram of an exemplary process 400 for controlling the clamping force Fc applied to the workpiece 10 to prevent damage while the workpiece 10 is secured by the electrostatic chuck 12. The process 400 depicted in FIG. 7 will be described using the terminology and information provided above.

The process 400 may include abutting the workpiece 10 against the electrostatic chuck 12 (operation 402A in FIG. 7A). The process 400 may also include inputting the clamp voltage setpoint 50A into the control system (operation 402B in FIG. 7A). The process 400 may also include inputting the clamp force setpoint 50B into the control system (operation 402C in FIG. 7A). The process 400 may also include applying the clamp voltage Vc to the electrodes 34A, 34B to cause the clamping force Fc causing the deflection Z of the workpiece 10 into the recess 16 (operation 402D in FIG. 7B). The process 400 may also include measuring the deflection Z of the workpiece 10 into the recess 16 with the sensor 26A (operation 402E in FIG. 7B). The process 400 may also include determining the clamping force Fc from the deflection Z measured by the sensor 26A (operation 402F in FIG. 7B). The process 400 may also include determining the clamping force error $E_{FC}$ as the difference between the clamping force $F_C$ determined and the clamping force setpoint 50B (operation 402G in FIG. 7B). The process 400 may also include determining the clamp voltage correction $C_{CV}$ using the PID controller 56 and the clamping force error $E_{FC}$ (operation 402H in FIG. 7B). The process 400 may also include updating the clamp voltage $V_C$ from the clamp voltage correction $C_{CV}$ and the clamp voltage setpoint 50A (operation 402I in FIG. 7B). The process 400 may also include the control system 24A determining whether an instruction has been received to remove the workpiece 10 from the electrostatic chuck, and if no instruction has been received then return to operation 402D, otherwise "end" (operation 402J in FIG. 7B). In this manner, the clamping force Fc may be controlled and the workpiece 10 protected by measuring the deflection Z of the workpiece 10 into the recess 16.

Figure 8:
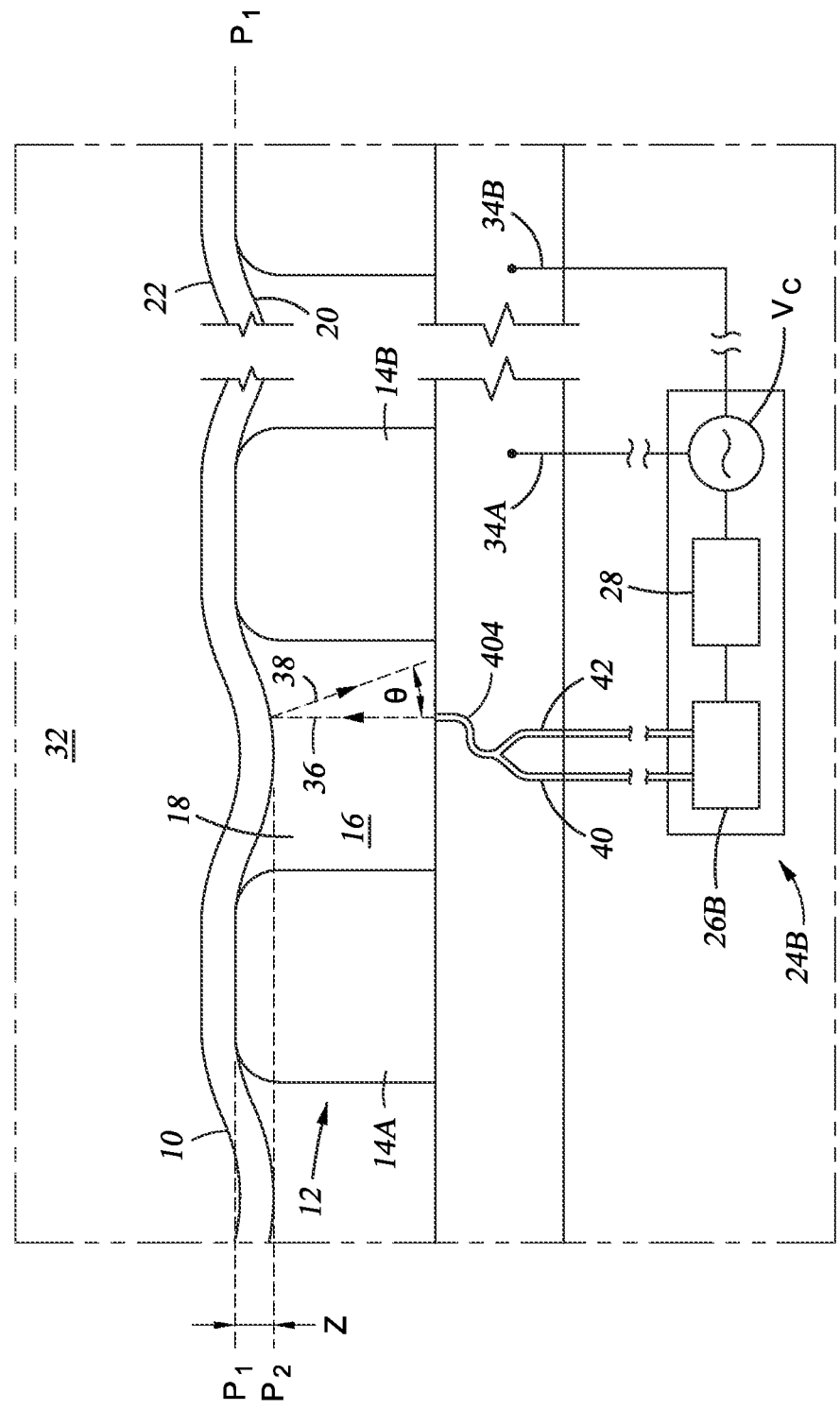
FIG. 8 is a schematic view of another embodiment of a sensor measuring the deflection of the workpiece into the recess.

Now that an exemplary method of controlling the clamping force Fc of the electrostatic chuck 12 has been introduced, FIG. 8 depicts another control system 24B similar to control system 24A depicted in FIGS. 1A through 1C and so only the differences will be discussed for conciseness and clarity. The sensor 26B may comprise a single optical fiber 404 which receives the radiation 36 from the radiation emitter 40 and emits the radiation 36 towards the workpiece 10. The portion 38 of the radiation 36 may be reflected at an angle theta (θ) from the workpiece 10. As the deflection Z of the workpiece 10 into the recess 16 increases, the angle theta (θ) also increases to decrease an amount of the portion 38 of the radiation 36 which is received back into the optical fiber 404 and detected by the radiation detector 42 optically connected to the optical fiber 404. In this manner, a footprint of the sensor 26B exposed within the recess 16 is minimized to reduce an opportunity for contamination of the workpiece 10.

Figure 9:
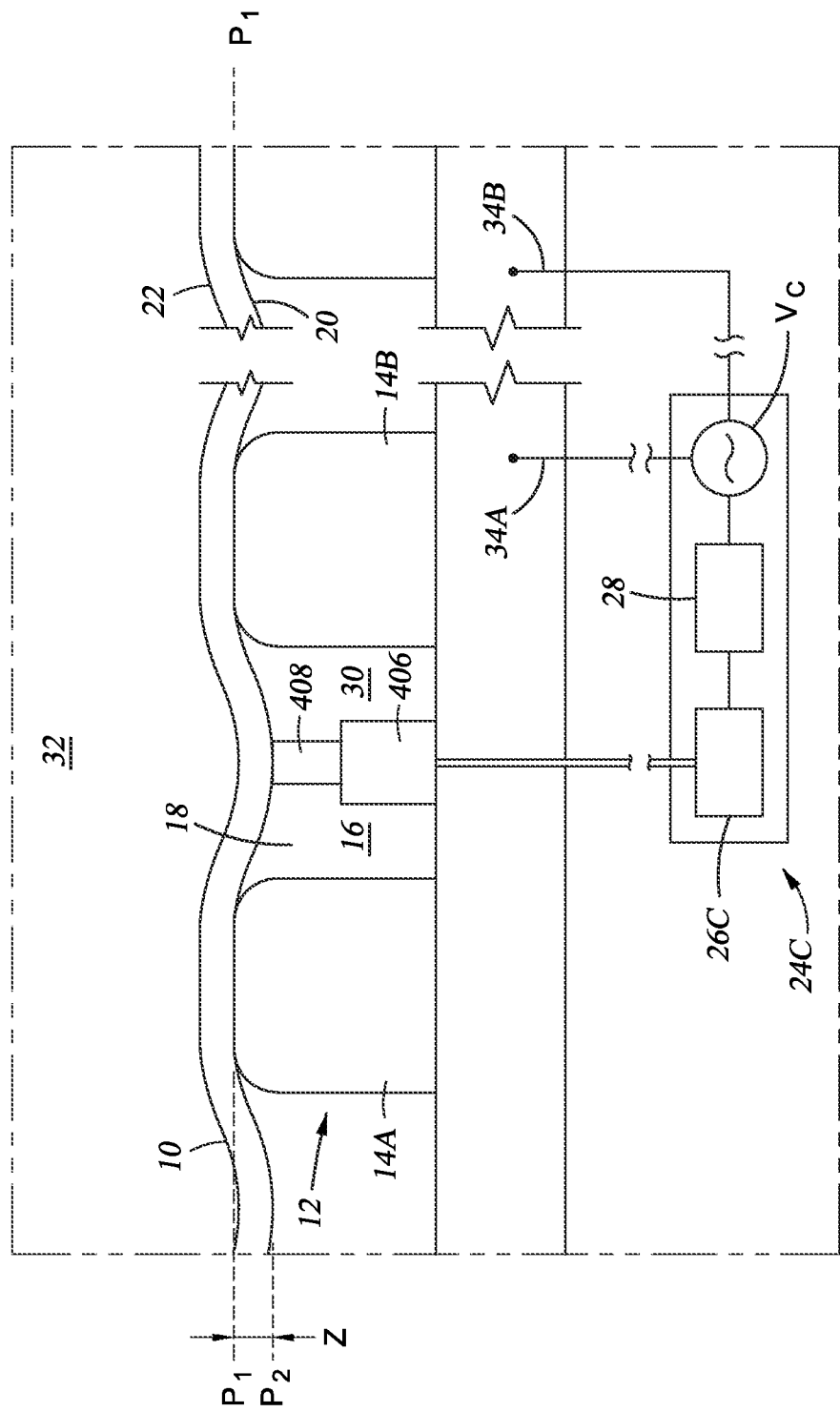
FIG. 9 is a schematic view of yet another embodiment of a sensor measuring the deflection of the workpiece into the recess.

Other embodiments of the control system 24A are possible utilizing different approaches to determine the deflection Z of the workpiece 10 into the recess 16 as the clamping force Fc is applied. FIG. 9 depicts a control system 24C comprising a sensor 26C which is similar to the control system 24A and so only the differences will be discussed for conciseness and clarity. The sensor 26C may comprise a load cell 406 to measure the deflection Z of the workpiece 10 by abutting against the workpiece 10 before, during and after the clamping force Fc is being applied. The load cell 406 may comprise a plunger 408 to abut against the workpiece 10 and traverse as the deflection Z occurs. In this manner, the deflection Z of the workpiece 10 may be used to determine the clamping force Fc applied to the workpiece 10 and the clamping force Fc may be controlled to prevent damage to the workpiece 10.

Figure 10:
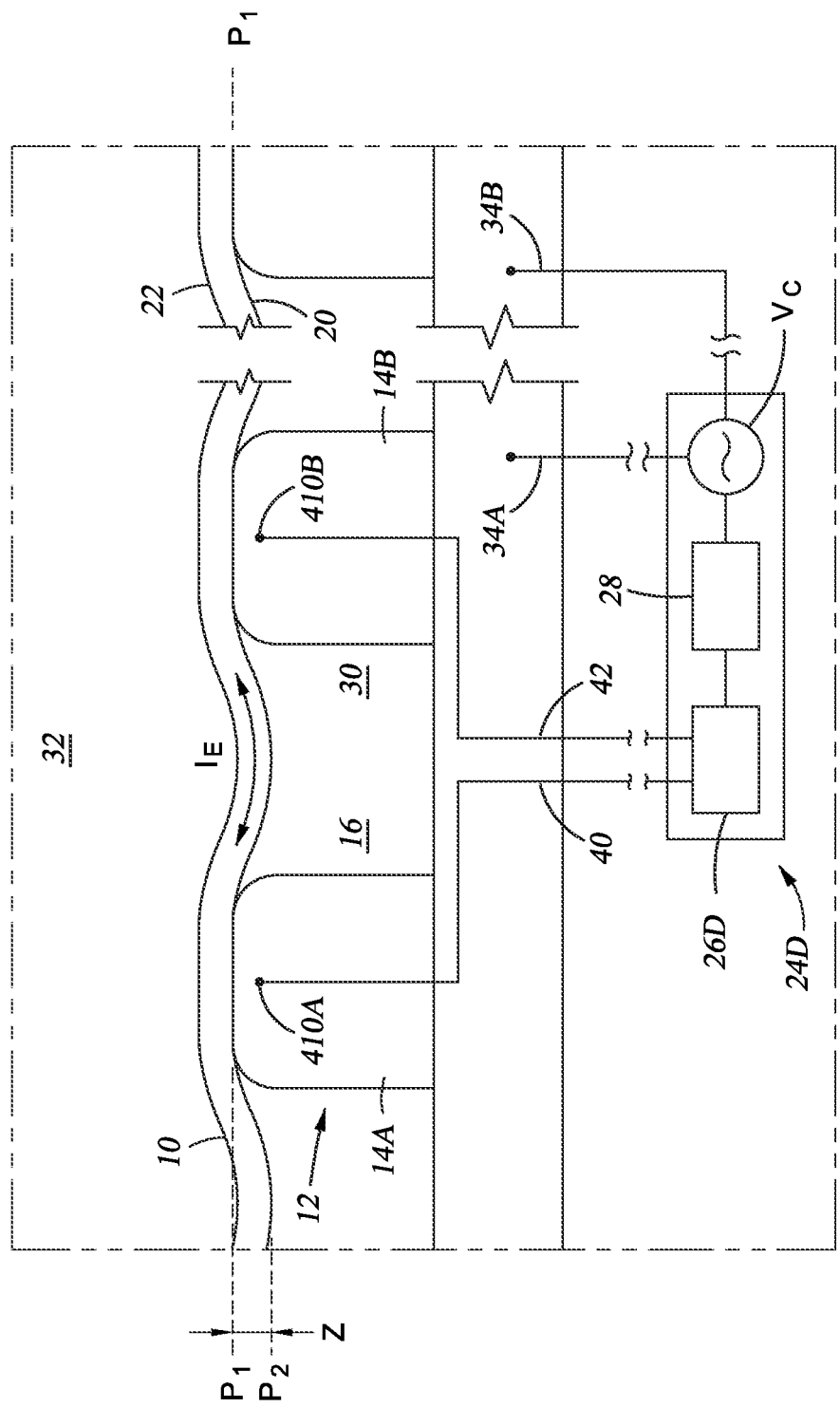
FIG. 10 is a schematic view of yet another embodiment of a sensor measuring a deflection of a workpiece into a recess.

Other embodiments of the control system 24A are possible utilizing different approaches to determine the deflection Z of the workpiece 10 into the recess 16. FIG. 10 depicts a control system 24D comprising a sensor 26D which is similar to the control system 24A and so only the differences will be discussed for conciseness and clarity. The sensor 26D may comprise deflection measurement electrodes 410A, 410B to measure the deflection Z of the workpiece 10 by inducing an electrical current IE in the workpiece 10 between the deflection measurement electrodes 410A, 410B. As the clamping force Fc is applied to the workpiece, the electrical current IE changes due to the deflection Z of the workpiece 10 into the recess 16. In this way, the deflection Z of the workpiece 10 may be used to determine the clamping force Fc applied to the workpiece 10 and the clamping force Fc may be controlled to prevent damage to the workpiece 10.

Figure 11:
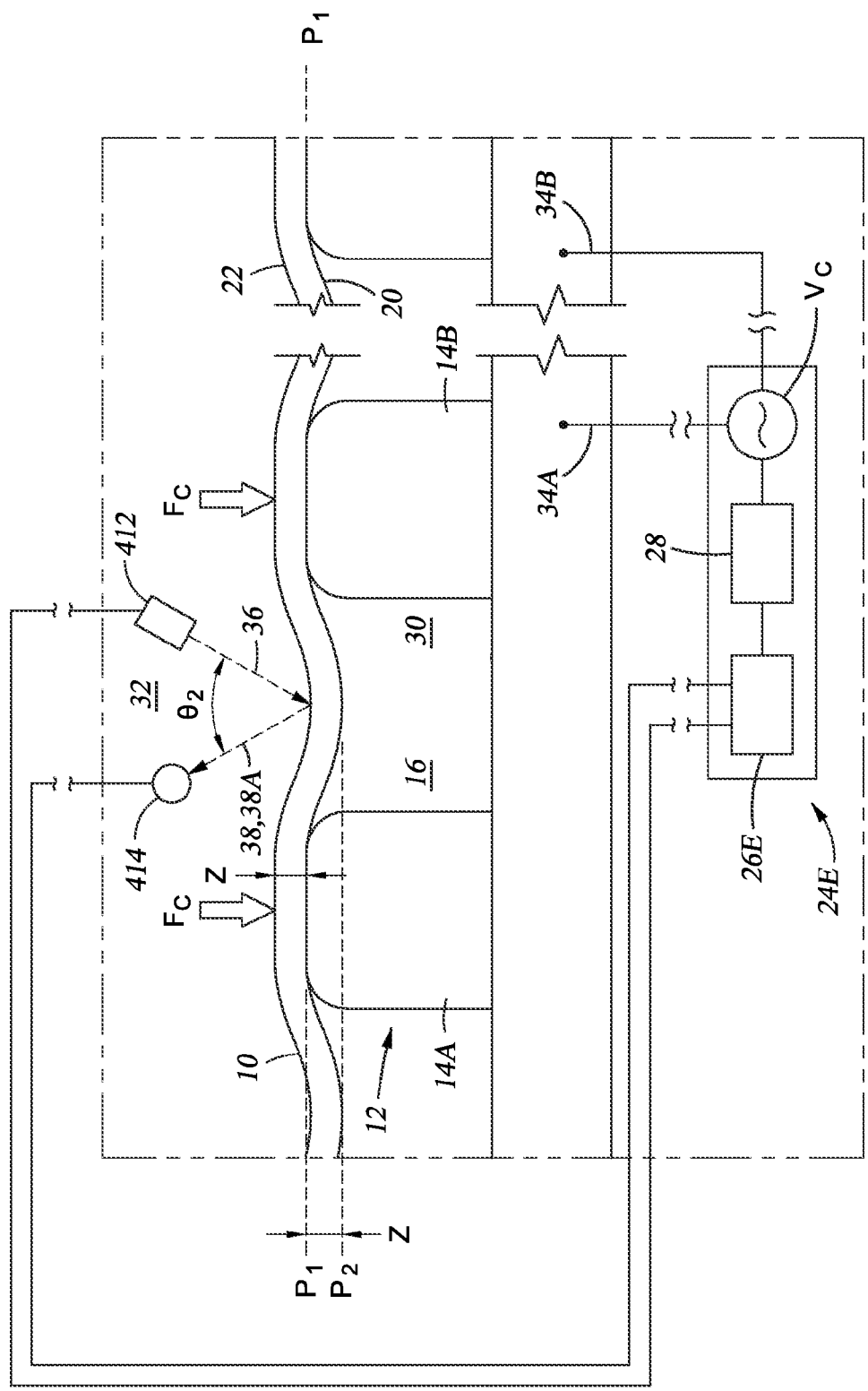
FIG. 11 is a schematic view of another embodiment of a sensor measuring a deflection of a workpiece into a recess.

Other embodiments of the control system 24A are possible utilizing different approaches to determine the deflection Z of the workpiece 10 into the recess 16. FIG. 11 depicts a control system 24E comprising a sensor 26E which is similar to the control system 24A and so only the differences will be discussed for conciseness and clarity. The sensor 26E may comprise a radiation emitter 412 to emit the radiation 36 against the workpiece 10 and measure the portion 38A of the radiation 38 reflected from the workpiece 10 as received at the radiation detector 414. In this embodiment, radiation 38 may be deflected from the frontside 22 of the workpiece 10. Also, the portion 38A of the radiation 36 as received at the radiation detector 414 may be dependent on an angle theta2 (θ2) which changes according to the deflection Z of the workpiece 10 which causes the frontside 22 to adopt a concave shape 416 where the radiation 38 is reflected. In this way, the deflection Z of the workpiece 10 may be used to determine the clamping force Fc applied to the workpiece 10 and the clamping force Fc may be controlled to prevent damage to the workpiece 10.

Many modifications and other embodiments not set forth herein will come to mind to one skilled in the art to which the embodiments pertain having the benefit of the teachings presented in the foregoing descriptions and the associated drawings. Therefore, it is to be understood that the description and claims are not to be limited to the specific embodiments disclosed and that modifications and other embodiments are intended to be included within the scope of the appended claims. It is intended that the embodiments cover the modifications and variations of the embodiments provided they come within the scope of the appended claims and their equivalents. Although specific terms are employed herein, they are used in a generic and descriptive sense only and not for purposes of limitation.

While the foregoing is directed to embodiments of the present invention, other and further embodiments of the invention may be devised without departing from the basic scope thereof, and the scope thereof is determined by the claims that follow.

What is claimed is:

1. A control system, comprising:
    an electrostatic chuck;
    a sensor positioned to determine a deflection of a workpiece into at least one recess of the electrostatic chuck as the electrostatic chuck applies a clamping force to the workpiece, wherein the sensor comprises an end portion of an optical fiber that is configured to emit a radiation from within the at least one recess; and
    a controller programmed to determine from the deflection the clamping force applied to the workpiece by the electrostatic chuck, and to adjust a clamping voltage at the electrostatic chuck so that the clamping force reaches and maintains a target clamping force.

2. The control system of claim 1, wherein the sensor comprises an interferometric displacement sensor.

3. The control system of claim 1, wherein the electrostatic chuck comprises a material comprising at least one of aluminum oxide or aluminum nitride.

4. The control system of claim 1, wherein the at least one recess of the electrostatic chuck is formed by adjacent mesas of a plurality of mesas of the electrostatic chuck, and the plurality of mesas are configured to support the workpiece.

5. The control system of claim 1, wherein the sensor is configured to emit a radiation to a surface of the workpiece and to measure the radiation reflected to determine the deflection.

6. The control system of claim 5, wherein the optical fiber is positioned to receive a portion of the radiation which is reflected from the surface of the workpiece to determine the deflection of the workpiece.

7. A plasma chamber, including a control system, comprising:
    an electrostatic chuck;
    a sensor positioned to determine a deflection of a workpiece into at least one recess of the electrostatic chuck as the electrostatic chuck applies a clamping force to the workpiece, wherein the sensor comprises an end portion of an optical fiber that is configured to emit a radiation from within the at least one recess; and
    a controller programmed to adjust a clamping voltage based on the deflection.

8. The plasma chamber of claim 7, wherein the sensor comprises an interferometric displacement sensor.

9. The control system of claim 7, wherein the controller comprises a proportional-integral-derivative (PID) controller.

10. The control system of claim 9, wherein the PID controller determines a clamping voltage correction.

11. The control system of claim 10, wherein the controller applies a clamping voltage to the electrostatic clamp, wherein the clamping voltage is the sum of the clamping voltage correction and a clamping voltage setpoint.

12. The control system of claim 10, wherein the PID controller receives a clamping force error, wherein the clamping force error is a difference between the clamping force and a clamping force setpoint.

13. A method for controlling a clamping force of an electrostatic chuck, comprising:
    determining with a sensor a deflection of a workpiece into at least one recess of an electrostatic chuck, wherein the sensor comprises an end portion of an optical fiber that is configured to emit a radiation from within the at least one recess;
    determining with a controller a measured clamping force applied to the workpiece by the electrostatic chuck; and
    applying with the controller a clamping voltage to the electrostatic chuck so that the clamping force reaches and maintains a target clamping force.

14. The method of claim 13, wherein the determining with the sensor comprises emitting a radiation to a surface of the workpiece and measuring a portion of the radiation which is reflected.

15. The method of claim 13, wherein the sensor comprises an interferometric displacement sensor.

* * * * *